(12) United States Patent
Park et al.

(10) Patent No.: US 7,826,276 B2
(45) Date of Patent: Nov. 2, 2010

(54) NON-VOLATILE MEMORY DEVICE REDUCING DATA PROGRAMMING AND VERIFICATION TIME, AND METHOD OF DRIVING THE SAME

(75) Inventors: Jae-Woo Park, Suwon-si (KR); Bong-soon Lim, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 377 days.

(21) Appl. No.: 12/003,381

(22) Filed: Dec. 21, 2007

(65) Prior Publication Data

US 2008/0151641 A1 Jun. 26, 2008

(30) Foreign Application Priority Data

Dec. 22, 2006 (KR) .................. 10-2006-0133079

(51) Int. Cl.
*G11C 7/10* (2006.01)
(52) U.S. Cl. .................. 365/189.05; 365/185.18; 365/185.17
(58) Field of Classification Search ............ 365/189.06, 365/189.05, 185.17, 185.18
See application file for complete search history.

(56) References Cited

U.S. PATENT DOCUMENTS 7,525,850 B2 * 4/2009 Chae et al. ............. 365/189.05

FOREIGN PATENT DOCUMENTS

| JP | 2006-048779 | 2/2006 |
|---|---|---|
| KR | 10-0568117 | 3/2006 |
| KR | 1020060028983 | 4/2006 |
| KR | 1020060032507 | 4/2006 |
| KR | 1020060056486 | 5/2006 |

* cited by examiner

*Primary Examiner*—Huan Hoang
(74) *Attorney, Agent, or Firm*—Harness, Dickey & Pierce, P.L.C.

(57) ABSTRACT

Provided are a non-volatile memory device in which time required for programming may be saved, and a method of driving the same. The non-volatile memory device may include a memory cell array with a plurality of memory cells; an input/output buffer having a storage unit that stores data and indicator bits representing information regarding the data; a data scanning unit that receives the stored data from the input/output buffer in units of scanning, and that scans the received data, the received data being selectively programmed in the memory cells according to a result of scanning the data; and/or a control logic unit that controls the data stored in the input/output buffer in units of scanning to be selectively supplied to the data scanning unit based on the states of the indicator bits.

20 Claims, 7 Drawing Sheets

NON-VOLATILE MEMORY DEVICE REDUCING DATA PROGRAMMING AND VERIFICATION TIME, AND METHOD OF DRIVING THE SAME

PRIORITY STATEMENT

The present application hereby claims priority under 25 U.S.C. §119 on Korean Patent Application No. 10-2006-0133079 filed Dec. 22, 2006, in the Korean Intellectual Property Office, the disclosure of which is incorporated herein in its entirety by reference.

BACKGROUND

A flash memory, which is a popular type of non-volatile memory, is a memory device that data may be electrically deleted from or written to. Flash memory not only consumes less power than storage media based on a magnetic disc memory but also has a shorter access time, similar to hard discs.

The flash memory may be categorized into a NOR type flash memory or a NAND type flash memory according to a connecting state between cells and bit lines. The NOR type flash memory has a structure in which two or more cell transistors may be connected in parallel to each bit line, and data may be stored therein using the channel hot electron method and data may be deleted therefrom using the Fowler-Nordheim (F-N) tunneling method. The NAND type flash memory has a structure in which two or more cell transistors may be connected in series to each bit line, and data may be stored therein or data may be deleted therefrom using the F-N tunneling method. In general, the NOR type flash memory uses a large amount of current and may not be easy to highly integrate but may operate at high speeds. In contrast, the NAND type flash memory may be easier to highly integrate since it uses less cell current than the NOR type flash memory.

Figure 1:
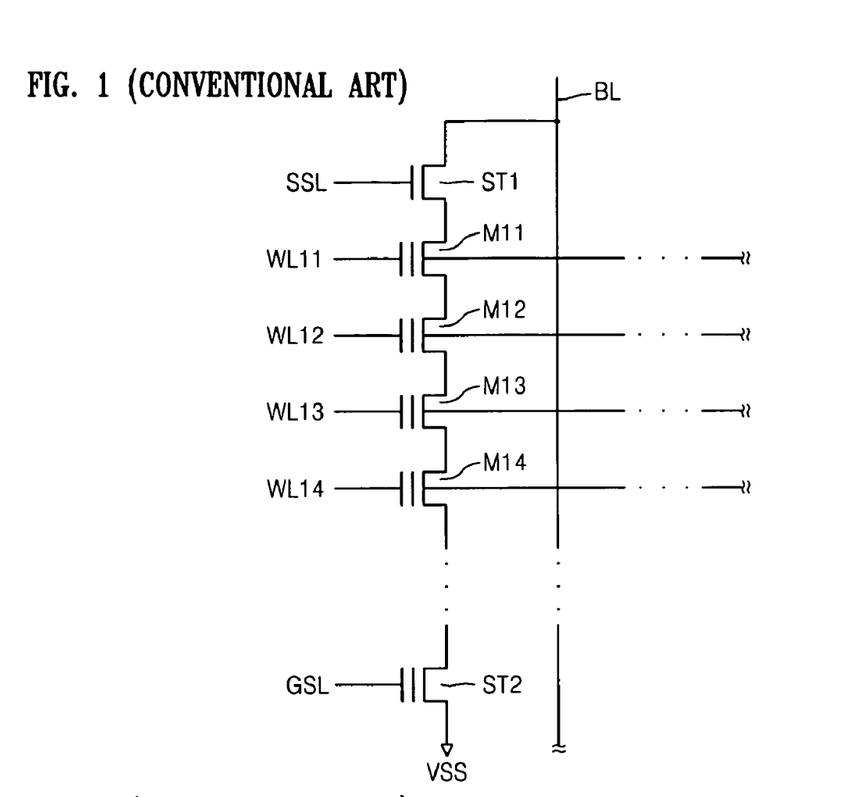
FIG. 1 is a circuit diagram of a memory cell structure included in a conventional NAND type flash memory.

FIG. 1 is a circuit diagram of a memory cell included in a conventional NAND type flash memory. FIG. 1 illustrates a plurality of word lines WL11 through WL14 and a plurality of memory cells M1 through M14. The memory cells M11 through M14 may form a string structure together with selection transistors ST1 and ST2, and may be connected in series between a bit line BL and a ground voltage source VSS. Since the NAND type flash memory may use a small amount of cell current, all memory cells connected to a word line may be programmed by performing a single programming operation.

Figure 2:
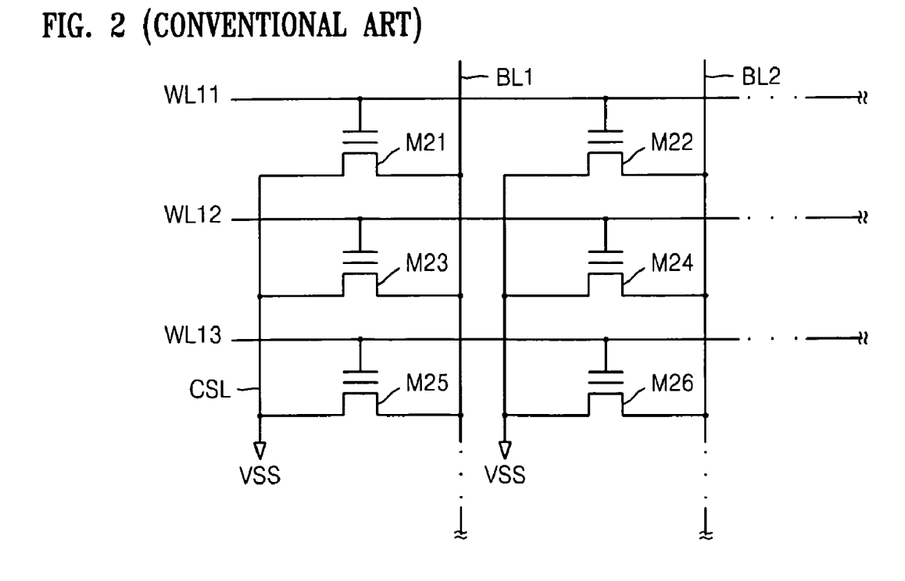
FIG. 2 is a circuit diagram of a memory cell structure included in a conventional NOR type flash memory.

FIG. 2 is a circuit diagram of a memory cell included in a conventional NOR type flash memory. Referring to FIG. 2, in the case of the NOR type flash memory, memory cells M21 through M26 may be connected between a bit line BL1 or BL2 and a common source line CSL. Since the NOR type flash memory may use a large amount of current to perform a programming operation, memory cells selected in units of bits may be programmed during a single programming operation.

In general, to program data in a memory cell array of a NOR type flash memory, a program command may be input to the flash memory, and then, a program address and data may be input to the flash memory. The input program address and data may be temporarily stored in a memory chip, and a memory cell corresponding to the program address may be selected. Next, a program voltage corresponding to the data may be applied to memory cells selected using a bit line, thereby programming the memory cells with the data.

Next, when a program execution timing that has been internally set has lapsed, a verification operation may be performed in order to determine whether data is normally or correctly programmed in a selected memory cell. The programming operation and the verification operation may be repeatedly performed until data is correctly programmed in a selected memory cell.

In the channel hot electron method used to program the NOR type flash memory, a programming current equal to or greater than a predetermined level may be required since a high voltage from 4 to 6 V may be applied to a drain of a memory cell. Thus, during programming of the NOR type flash memory, the total number of memory cells that may be programmed at a time may be limited to the range from 2 to 4. For example, if the total number of bits that may be programmed at a time is 4, 16-bit data may be divided into four pieces of 4-bit data, and programmed in a memory cell a total of four times.

Figure 3A:
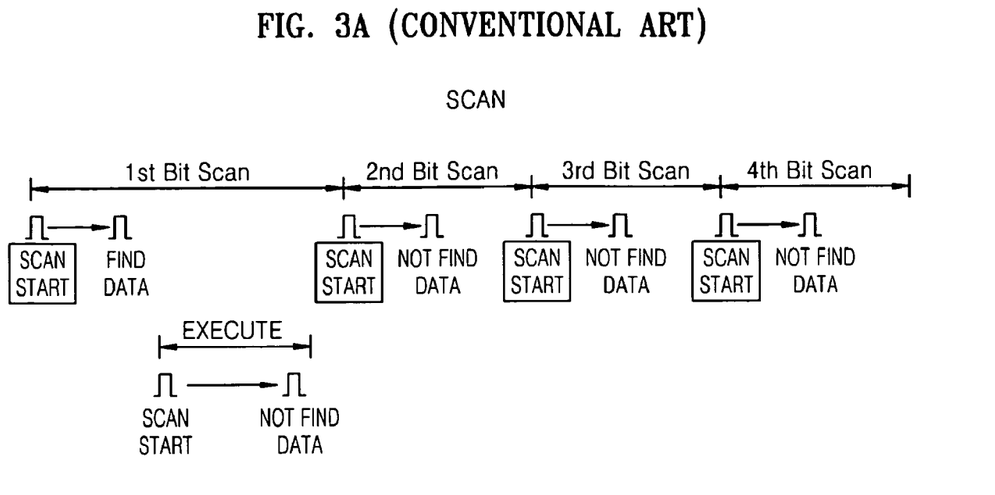
FIGS. 3A and 3B illustrate a data scanning section and a data sensing section of a conventional flash memory.
Figure 3B:
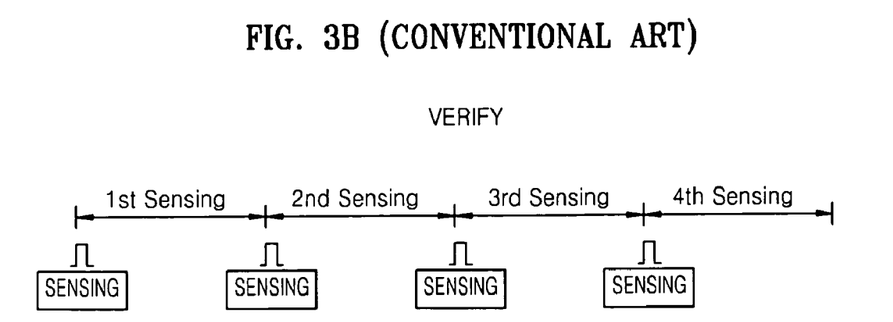

FIGS. 3A and 3B illustrate a data scanning section and a data sensing section of a conventional flash memory. In particular, FIG. 3A illustrates a scanning section of program data received from an input/output (I/O) buffer (not shown) during programming of a flash memory device, and FIG. 3B illustrates a data sensing section during a verification operation for determining whether data bits may be correctly programmed in a memory cell.

In a conventional buffer programming method applied to flash memory devices, a scanning operation may be performed on data received from an I/O buffer in units of scanning, e.g., in units of n words (n is an integer). For example, erasing may be performed on memory cells before programming them so as to detect data of "0" from among the received data when data stored in the memory cells is "1".

Next, the data of "0" may be actually programmed in the memory cells. In this case, since all the pieces of the data in the units of scanning may be "1", scanning may be performed on the data even if there is no data to be programmed, and the programming may be discontinued after obtaining information that no data is detected.

As illustrated in FIG. 3A, if data that is a first unit of scanning is provided, scanning may be performed on the data in order to detect data of "0" from among the data. If data of "0" is detected as the result of scanning, the detected data may be programmed in the memory cell.

Next, if data that is a second unit of scanning is provided, scanning may be performed on the data. If data that is to be actually programmed is not detected as the result of scanning, data corresponding to the second unit of scanning may be not programmed in the memory cell. That is, even if data that is to be actually programmed is not included in the unit of scanning, scanning may be unnecessarily performed on the data in order to detect data of "0" from among the data, thereby increasing a time for data programming.

Also, if programming of data stored in the I/O buffer is completed, the verification operation may be performed in order to determine whether the data has been normally or correctly programmed in the memory cell. To this end, sensing may be performed on the data stored in the memory cell. As illustrated in FIG. 3B, even if no cells are programmed since data in units of scanning is not "0", sensing may be unnecessarily performed for the corresponding cell region in the memory cell. Also, even if reprogramming is not needed since verification of a programmed memory cell is passed, scanning may be unnecessarily performed during reprogramming.

SUMMARY

Example embodiments may provide a non-volatile memory device in which unnecessary scanning or sensing may be skipped in order to reduce a time needed for data programming and verification, and a method of driving the same.

Example embodiments may provide a non-volatile memory device including the following: a memory cell array with a plurality of memory cells; an input/output buffer having a storage unit that stores data and indicator bits representing information regarding the data; a data scanning unit that receives the stored data from the input/output buffer in units of scanning, and that scans the received data, the received data being programmed in the memory cells according to a result of scanning the data; and/or a control logic unit that controls the data stored in the input/output buffer in units of scanning to be selectively supplied to the data scanning unit, based on the states of the indicator bits.

According to example embodiments, the storage unit of the input/output buffer may include a first storage unit that stores the data and a second storage unit that stores the indicator bits. The first storage unit may include first through $m^{th}$ data storage units that stores the data in units of scanning, where m may be an integer equal to or greater than 1, and the second storage unit may include first through $m^{th}$ indicator bit storage units which respectively correspond to the first through $m^{th}$ data storage units. The indicator bit storage unit may store the indicator bit with a first logic level if data stored in the corresponding data storage is to be programmed in the memory cells, and the indicator bit storage unit may store the indicator bit with a second logic level if data stored in the corresponding data storage unit is not to be programmed in the memory cells.

According to example embodiments, the indicator bit storage unit may store the indicator bits with the second logic level when all the data stored in the corresponding data storage unit is logic high. If the indicator bits have the first logic level, the control logic unit may control data, in units of scanning, which corresponds to the indicator bits to be supplied to the data scanning unit. The control logic unit may include a data detecting unit that detects the data supplied to the input/output buffer; and an indicator bit controller that controls writing of the indictor bits based on the result of detecting.

According to example embodiments, the indicator bit controller may set the corresponding indicator bits to a first logic level if at least one piece of the data to be written to the storage unit supplied in units of scanning is logic low, and the indicator bit controller may set the corresponding indicator bit to a second logic level if all the data supplied in units of scanning are logic high. The control logic unit may selectively sense a cell region of the memory cell array to according to the states of the indicator bits to verify the result of programming during verification.

According to example embodiments, the control logic unit may control the data stored in the input/output buffer in units of scanning to be selectively supplied to the data scanning unit based on the result of verification for data reprogramming. The indicator bit controller may set the corresponding indicator bit to the first logic level if the result of verification reveals that a program error has occurred in the data in units of scanning, and the indicator bit controller may set the corresponding indicator bit to the second logic level if the result of verification reveals that the data in units of scanning is correctly programmed. The memory cell array may be a NOR type flash memory cell array.

Example embodiments may provide a method of driving a non-volatile memory device with a memory cell array including the following: storing data in an input/output buffer; writing indicator bits corresponding to the data in units of scanning; controlling the stored data to be selectively output in units of scanning, based on the logic level of the indicator bits; scanning the data that is selectively output in units of scanning; and/or programming the data in the memory cell array according to a result of the scanning.

BRIEF DESCRIPTION OF THE DRAWINGS

The above and other features and advantages of example embodiments will become more apparent by describing in detail example embodiments with reference to the attached drawings in which.

DETAILED DESCRIPTION

Example embodiments will now be described more fully with reference to the accompanying drawings. Like reference numerals denote like elements throughout the drawings.

Figure 4:
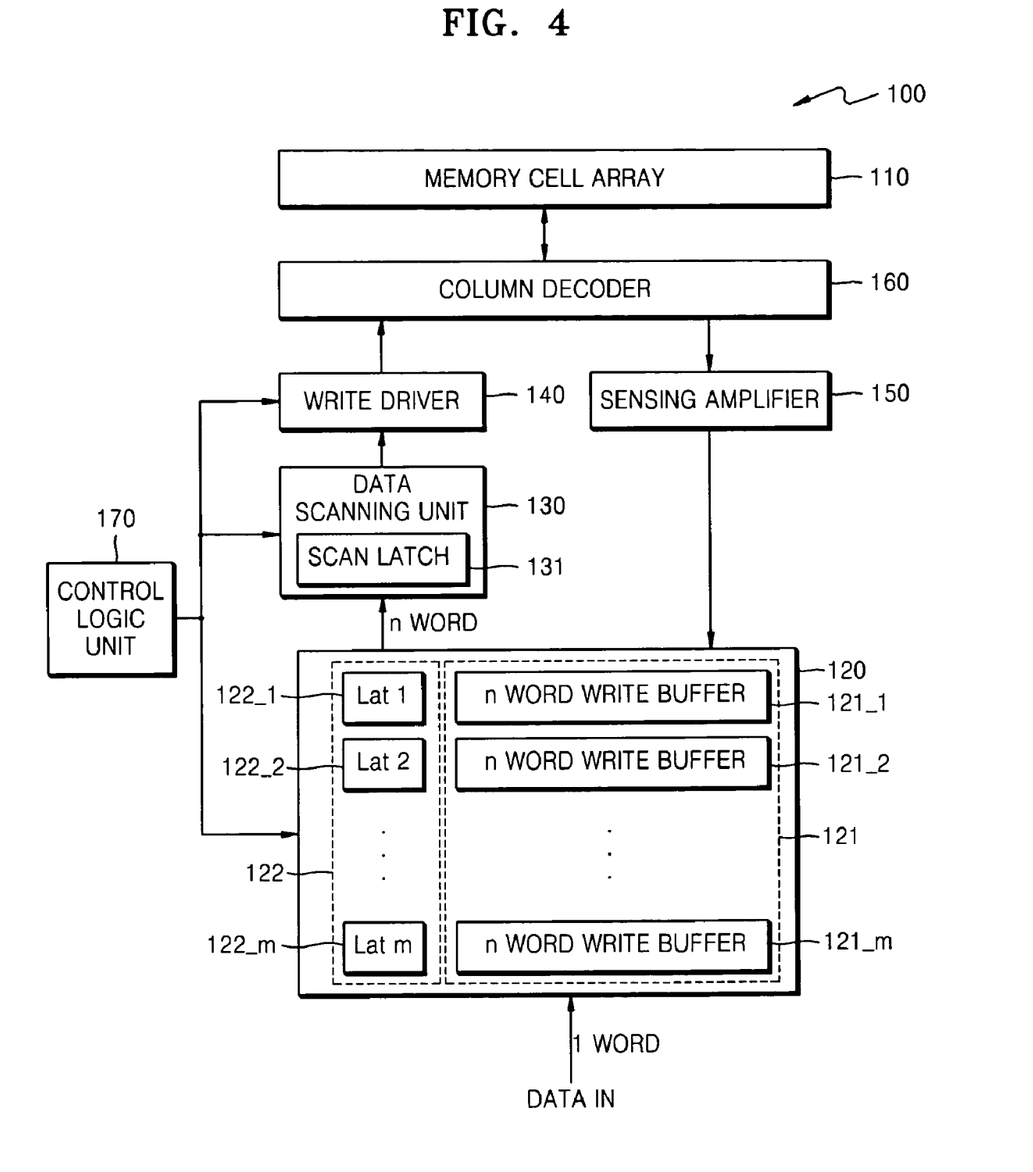
FIG. 4 is a block diagram of a non-volatile memory device according to example embodiments.

FIG. 4 is a block diagram of a non-volatile memory device 100 according to example embodiments. Referring to FIG. 4, the non-volatile memory device 100 may include a memory cell array 110 with a plurality of memory cells, and peripheral circuits for driving the memory cell array 110. As an example, the memory cell array 110 may be embodied as a NOR type flash memory cell array.

The peripheral circuits may include an input/output (I/O) buffer 120, a data scanning unit 130, a write driver 140, a sensing amplifier 150, and/or a column decoder 160. Also, a control logic unit 170 that controls the overall operations of the peripheral circuits may be further included as a peripheral circuit.

The I/O buffer 120 may include a first storage unit 121 that stores received external data, and a second storage unit 122 that stores indicator bits representing information regarding the data.

The first storage unit 121 may include at least one data storage unit that stores data, which consists of n words, in units of scanning. For example, the first storage unit 121 may include first through $m^{th}$ data storage units 121_1 through 121_m each storing data in units of scanning.

The indicator bits stored in the second storage unit 122 may represent the information regarding data input to the I/O buffer 120 in units of scanning. Generally, the indicator bits corresponding to the respective data in units of scanning may be categorized into different logic levels according to the values of the data, and may be then stored in the second storage unit 122.

Generally, if data that is to be programmed in the memory cell array 100 is detected as the result of detecting the data input to the I/O buffer 120 in units of scanning, an indicator bit with a first logic level (high) may be stored in the second storage unit 122. If data that is to be programmed in the memory cell array 100 is not detected, an indicator bit with a second logic level (low) may be stored in the second storage unit 122.

To program a non-volatile memory such as a flash memory, a target address of a memory cell of the non-volatile memory may be erased before programming. As a result of erasing, the memory cell may have a value of "1". That is, programming may be performed on the non-volatile memory in order to convert "1"s into "0"s. Thus, when input data is "1", even if programming is not actually performed on the memory cell array 110, the same result may be achieved as if the memory cell was programmed.

Accordingly, detecting may be performed on the data input to the I/O buffer 120 in units of scanning in order to determine whether at least one piece of data of "0" exists in the input data. If at least one piece of data of "0" exists, the indicator bits corresponding to the data in units of scanning may have the first logic level, and if all the data in units of scanning are "1", the indicator bits corresponding to the data in units of scanning may have the second logic level.

The second storage unit 122 that stores the indicator bits may include first through $m^{th}$ indicator bit storage units 122_1 through 122_m that respectively correspond to the first through $m^{th}$ data storage units 121_1 through 121_m. As an example, the first through $m^{th}$ indicator bit storage units 122_1 through 122_m may be latches.

The first indicator bit storage unit 122_1 may store an indicator bit upon which the logic level varies according to the value of data stored in the first data storage unit 121_1. If at least one piece of the data stored in first data storage unit 121_1 is "0", the indicator bit may have the first logic level. If all pieces of the data stored in the first data storage unit 121_1 are "1", the indicator bit may have the second logic level. The logic levels of the indicator bits stored in the second through $m^{th}$ indicator bit storage units 122_2 through 122_m may be determined similarly.

The data stored in the I/O buffer 120 may be input to the data scanning unit 130 under control of the control logic unit 170. For example, the data stored in the respective data storage units 121_1 through 121_m in units of scanning (the data consists of n words) may be sequentially input to the data scanning unit 130. According to example embodiments, the data corresponding to the indicator bits may be selectively input to the data scanning unit 130 in units of scanning, according to the states of the indicator bits.

The control logic unit 170 may control the data stored in the I/O buffer 120 to be selectively input to the data scanning unit 130. That is, the control logic unit 170 may first check the logic levels of the indicator bits before outputting the data, and then control the data corresponding to the indicator bits to be selectively output in units of scanning, according to the logic levels of the indicator bits. For example, if the indicator bit has the first logic level, the control logic unit 170 may control the data of scanning unit corresponding to the indicator bit to be input to the data scanning unit 130 in units of scanning. If the indicator bit has the second logic level, the control logic unit 170 may control the data corresponding to the indicator bit not to be input to the data scanning unit 130.

The data scanning unit 130 may perform scanning of the received data in units of scanning in order to detect data of "0" from among the received data. When scanning, the data scanning unit 130 may include a scan latch 131 that stores the data received from the I/O buffer 120.

In the scanning operation, if the total number of data of "0" reaches a predetermined value (a maximum bit rate that the write driver 140 may program at a time), the data and corresponding address information may be provided to the write driver 140 under control of the control logic unit 170. The write driver 140 may perform programming of the memory cell array 110, using the data and address information received from the data scanning unit 130. The column decoder 160 may select a bit line (not shown) of the memory cell array 110, which corresponds to the address information received from the data scanning unit 130.

After programming data in the memory cell array 110, a verification operation may be performed in order to verify whether the data has been correctly programmed in the memory cell array 110. The verification operation may include sensing and amplifying the data stored in the memory cell array 110. The verification operation may be performed by the sensing amplifier 150 as illustrated in FIG. 4. The construction of a circuit that actually performs verification using the data sensed by the sensing amplifier 150 under control of the control logic unit 170, would be obvious to those of ordinary skilled in the art, and therefore, a detailed description thereof will be omitted.

For verification, in the sensing operation of the memory cell array 110, the control logic unit 170 may control a cell region of the memory cell array 110 to be selectively sensed according to the states of the indicator bits stored in the I/O buffer 120. For example, the indicator bit may be read from a first indicator bit storage unit 122_1 based on the address supplied to the I/O buffer 120, and the logic level of the indicator bit may be determined. If the indicator bit has the first logic level, data stored in a region of the memory cell array 110 corresponding to the indicator bit may be read. If the indicator bit has the second logic level, reading of data from a region of the memory cell array 110 that corresponds to the indicator bit may be skipped.

Conventionally, for verification, sensing may be performed on memory cells corresponding to all data stored in the I/O buffer 120, but according to example embodiments, sensing may be performed only on a partial region of the memory cell array 110 according to the states of indicator bits. Accordingly, it may be possible to prevent unnecessary sensing of a memory cell in which programming has not been performed.

The control logic unit 170 may update the indicator bits stored in the first through $m^{th}$ indicator bit storage unit 122_1 through 122_m, based on the result of verifying the sensed data. For example, if the verification of the result of programming reveals that a program error has occurred (verify fail), the control logic unit 170 may control the indicator bits to be maintained at the first logic level. Thus, reprogramming may be performed by supplying the data to the data scanning unit 130 in units of scanning.

However, if the verification of the result of programming reveals that the data has been correctly programmed (verify pass), the control logic unit 170 may control the corresponding indicator bits to have the second logic level. Accordingly, it may be possible to prevent unnecessary scanning of the data, in units of scanning, which has been correctly programmed.

Figure 5:
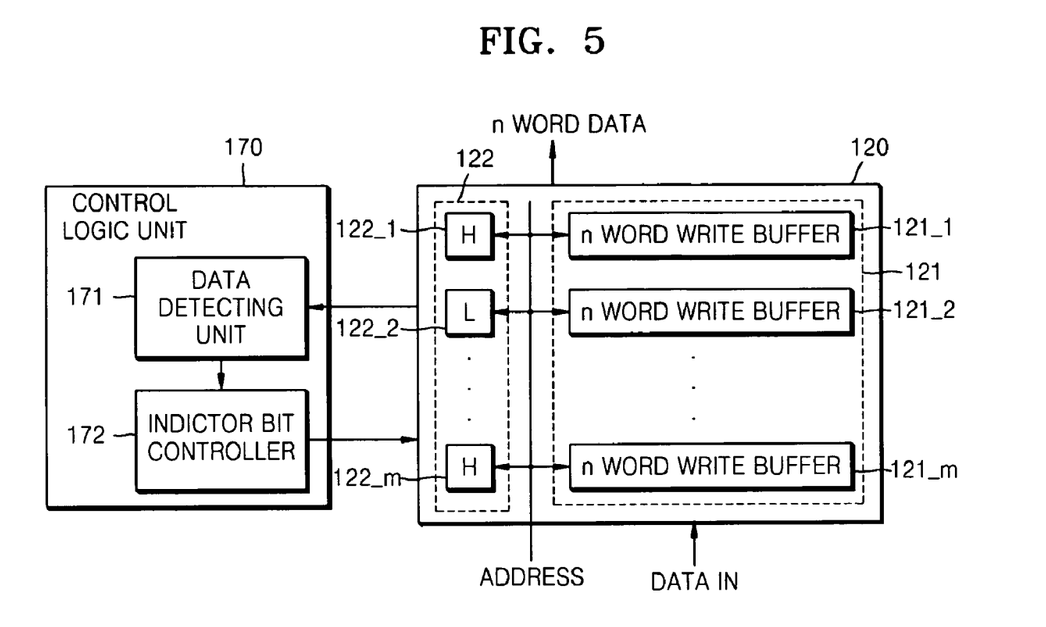
FIG. 5 illustrates in detail the operation of a control logic unit of FIG. 4 according to example embodiments.

FIG. 5 is a block diagram illustrating in more detail the operation of the control logic unit 170 of FIG. 4, according to example embodiments. Referring to FIG. 5, the control logic unit 170 may include a data detecting unit 171 and an indicator bit controller 172. Also, the I/O buffer 120 may include the first through $m^{th}$ data storage units 121_1 through 121_$m$ and the first through $m^{th}$ indicator bit storage units 122_1 through 122_$m$. Also, in order to read data and indicator bits from the I/O buffer 120, an address may be provided to the first through $m^{th}$ data storage units 121_1 through 121_$m$ and the first through $m^{th}$ indicator bit storage units 122_1 through 122_$m$.

When data is supplied to the I/O buffer 120 in units of a word, the data detecting unit 171 may detect the logic level of the data. For example, the data detecting unit 171 may detect the data stored in the first data storage unit 121_1 in units of scanning, and provide a signal representing the result of detecting to the indicator bit controller 172. The indicator bit controller 172 may control the indicator bit stored in the first indicator bit storage unit 122_1, to have a predetermined logic level in response to the signal. For example, if at least one piece of the data corresponding to the first data storage unit 121-1 is "0", the indicator bit controller 172 may control the indicator bits to be written with logic high (H) in the first indicator bit storage unit 122-1.

Also, if the data that is to be stored in the second data storage unit 121_2 is supplied to the I/O buffer 120, the data detecting unit 171 may detect the logic level of the data as described above. The indicator bit controller 172 may control the indicator bit stored in the second indicator bit storage unit 122_2, to have a predetermined logic level, based on the result of sensing. For example, if all the pieces of the data in units of scanning are detected to be "1", the indicator bit controller 172 may control the indicator bits with to be written logic low (L).

As described above, it may be possible to verify data sensed from the memory cell array 110, and update the values of indicator bits stored in the first through $m^{th}$ indicator bit storage units 122_1 through 122_$m$ based on the result of verification. In this case, although not shown, a signal indicating the result of verification may be transmitted to the indicator bit controller 172, and the indicator bit controller 172 may be embodied to control the logic levels of the indicator bits using the signal indicating the result of verification.

Figure 6A:
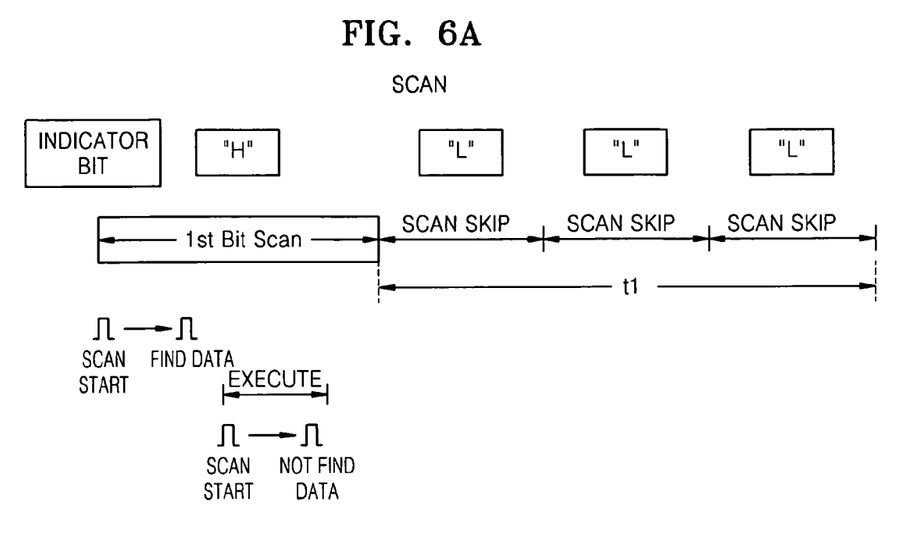
FIGS. 6A and 6B illustrate a data scanning section and a data sensing section of the non-volatile memory device of FIG. 4 according to example embodiments.
Figure 6B:
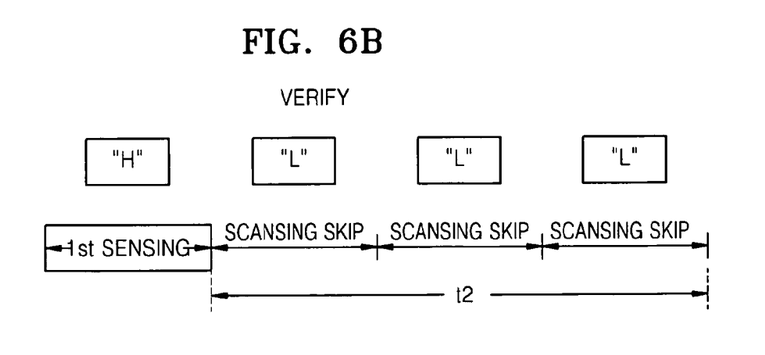

FIGS. 6A and 6B illustrate a data scanning section and a data sensing section of the non-volatile memory device 100 of FIG. 4 according to example embodiments. FIG. 6A illustrates a section in which the data scanning unit 130 performs scanning for programming the non-volatile memory device 100 according to example embodiments. First, if an indicator bit corresponding to data of a scanning unit stored in the I/O buffer 120 has a first logic level, e.g., logic high (H), the data may be transmitted to the data scanning unit 130. The data scanning unit 130 may then perform a scanning operation on the transmitted data. Next, if the total number of data of "0" reaches a program bit rate, the data and address information corresponding to the data may be provided to the write driver 140 under control of the control logic unit 170.

Next, if an indicator bit corresponding to the next data of scanning unit of scanning has a second logic level, e.g., logic low (L), the data may be prevented from being input to the data scanning unit 130. Thus, the data scanning unit 130 may skip scanning of the data. Referring to FIG. 6A, since all indicator bits corresponding to data in the next units of scanning have the second logic level, scanning of the data in the next bits of scanning may be skipped, thereby saving a time t1 required for data scanning.

FIG. 6B illustrates sensing of the data stored in the memory cell array 110 in order to perform verification after data programming. Referring to FIG. 6B, the state of an indicator bit may be determined after data programming, and if the first indicator bit has the first logic level, a corresponding address region of the memory cell array 110 may be sensed. If the state of the indicator bit is determined to have the second logic level, sensing of a corresponding address region of the memory cell array 110 may be skipped. In this way, it may be possible to save a time t2 required for data sensing for verification.

Figure 7:
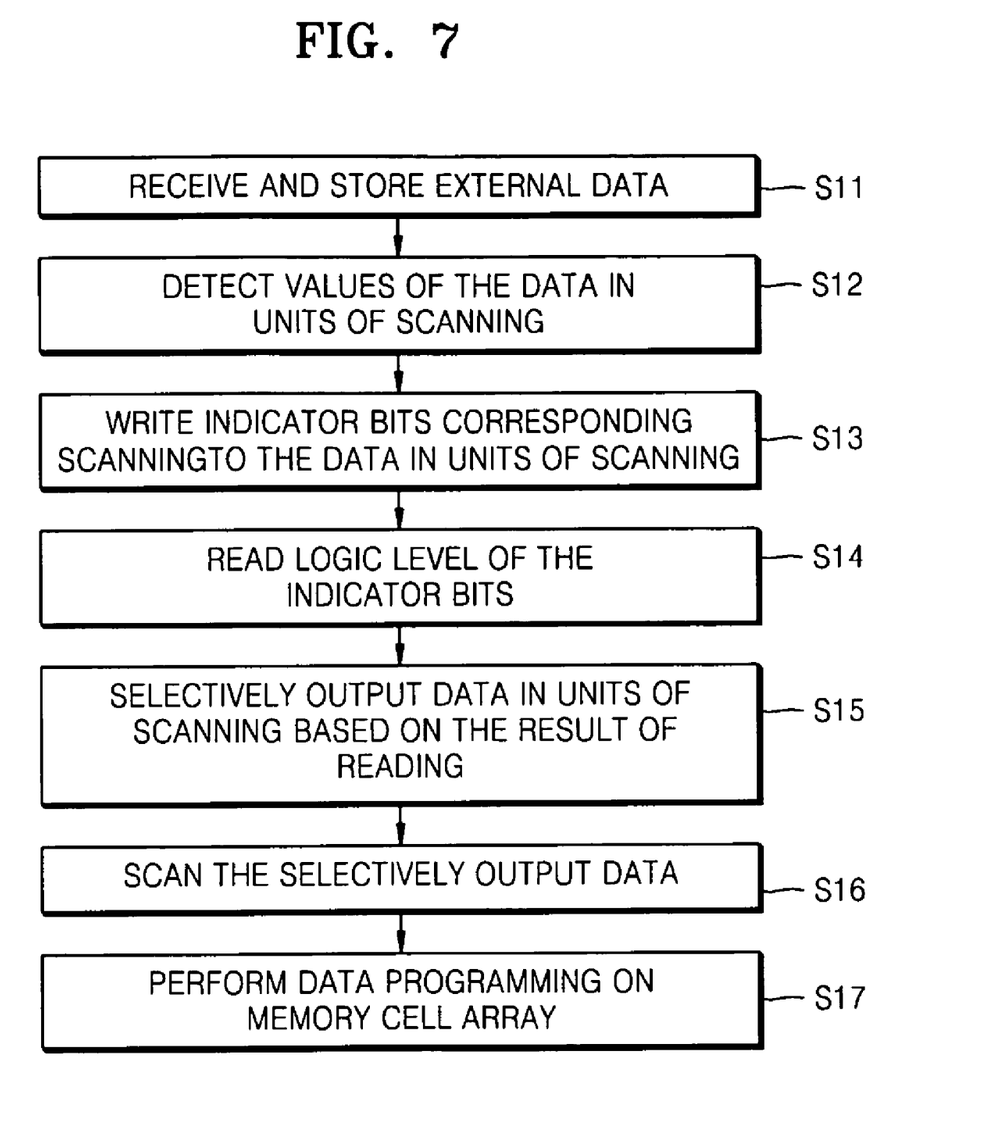
FIG. 7 is a flowchart illustrating a method of programming a non-volatile memory device according to example embodiments.

FIG. 7 is a flowchart illustrating a method of programming a non-volatile memory device according to example embodiments. Referring to FIG. 7, external data may be supplied to an I/O buffer of a non-volatile memory device, and the data may be stored in a storage unit of the I/O buffer (operation S11).

During the supply of the data to the I/O buffer, the values of the data may be detected in units of scanning (in units of n words) (n may be an integer equal to or greater than 1) (operation S12). For example, it may be detected whether the data in units of scanning includes data that is to be actually programmed in memory cells. As described above, it may be detected whether at least one piece of the data in units of scanning is "0", or whether all the pieces of the data are "1".

Next, indicator bits corresponding to the data in units of scanning may be written based on the result of detecting (operation S13). For example, if it is detected that at least one piece of the data in units of scanning is "0", an indicator bit with logic high may be written, and if all the pieces of the data in units of scanning are "1", an indicator bit with logic low may be written. The indicator bits may be written in an additional storage unit included in the I/O buffer.

Next, for data scanning, the indicator bits may be read before supplying the data stored in the I/O buffer to a data scanning unit, and the logic levels of the indicator bits may be determined (operation S14). Next, the data in units of scanning may be selectively supplied to the data scanning unit, based on the result of determination (operation S15). During determination, if the indicator bit is logic high, data of scanning unit corresponding to the indicator bit may be supplied to the data scanning unit. If the indicator bit is logic low, data of scanning unit corresponding to the indicator bit may be prevented from being supplied to the data scanning unit.

Next, scanning may be performed on the selectively supplied data in order to detect data of "0" from among the data (operation S16). After the scanning, data programming may be performed in a memory cell array (operation S17).

Figure 8:
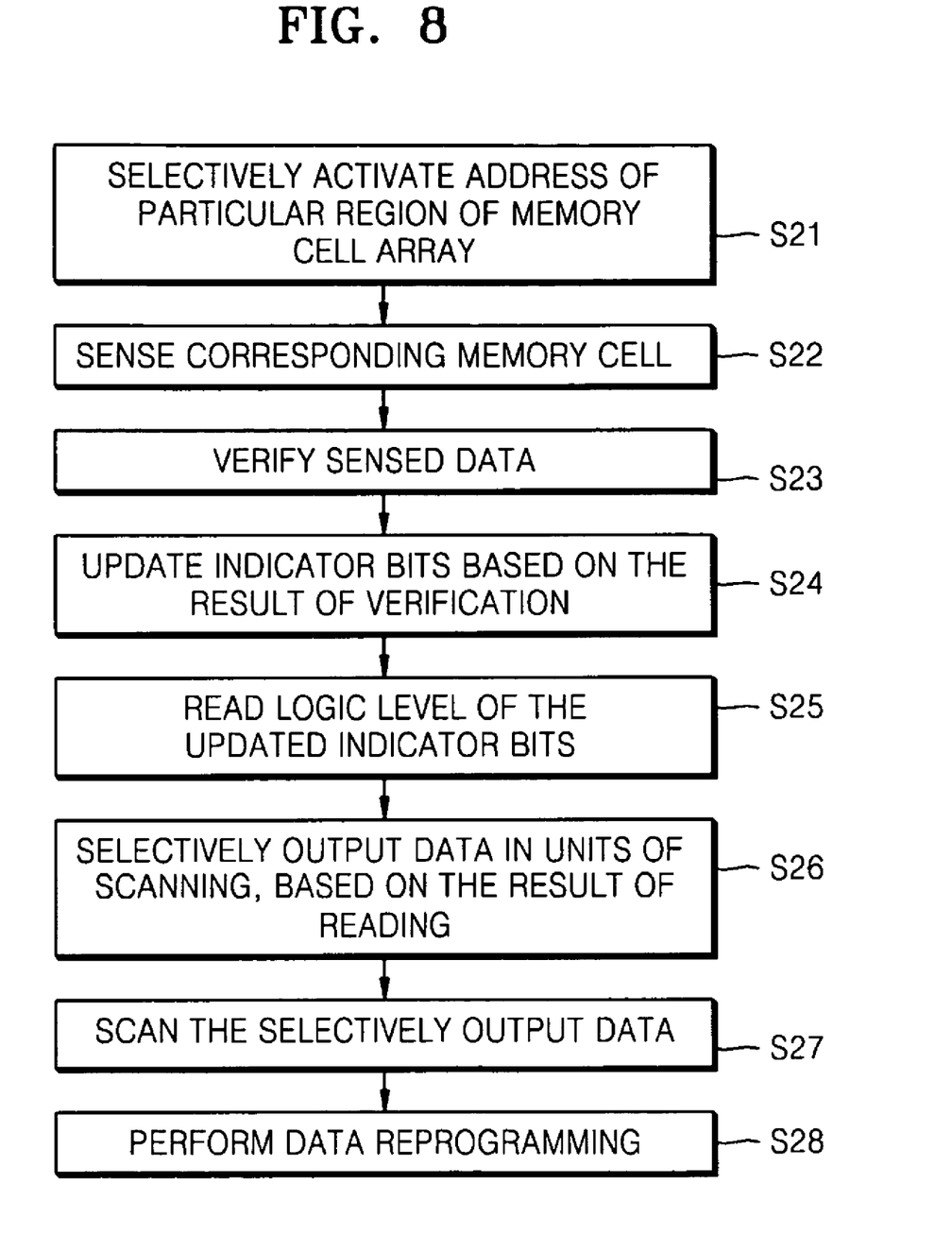
FIG. 8 is a flowchart illustrating a method of verifying a non-volatile memory device according to example embodiments.

FIG. 8 is a flowchart illustrating a method of verifying a non-volatile memory device according to example embodiments. During verification, the address of a specific region of the memory cell array may be selectively activated in order to perform a read operation on a memory cell array. For example, the addresses of regions which correspond to the indicator bits may be selectively activated based on the states of the indicator bits (operation S21).

Next, when the address is activated, sensing may be performed on a corresponding cell region of the memory cell array (operation S22). Next, verification may be performed on data sensed as the result of sensing (operation S23).

Next, the indicator bits may be updated based on the result of verification (operation S24). If the result of verification reveals that a programming error has occurred in the sensed data, the corresponding indicator bits may be maintained at a first logic level. If the result of verification reveals that the sensed data has been correctly programmed, the logic level of the corresponding indicator bits may be updated to be a second logic level.

Next, for reprogramming, the updated logic level of the indicator bits may be read (operation S25). Next, the data may be selectively supplied to a data scanning unit in units of scanning, based on the result of reading (operation S26). In this case, as described above, the data of scanning unit which corresponds to the indicator bit with the second logic level may be prevented from being supplied to the data scanning unit. Accordingly, it may be possible to prevent unnecessary scanning of the data, in units of scanning, which have been correctly programmed during reprogramming.

Thereafter, scanning may be performed on the selectively supplied data (operation S27), and then, the data may be reprogrammed (operation S28).

The above semiconductor memory device according to example embodiments may selectively perform scanning and sensing of data in units of scanning, based on the logic levels of indicator bits, thereby saving a time required for data programming and verification.

The above-disclosed subject matter is to be considered illustrative, and not restrictive, and the appended claims are intended to cover all such modifications, enhancements, and other example embodiments, which fall within the true spirit and scope of the present example embodiments. Thus, to the maximum extent allowed by law, the scope of example embodiments is to be determined by the broadest permissible interpretation of the following claims and their equivalents, and shall not be restricted or limited by the foregoing detailed description.

What is claimed is:

1. A non-volatile memory device comprising:
a memory cell array with a plurality of memory cells;
an input/output buffer having a storage unit that stores data and indicator bits representing information regarding the data;
a data scanning unit that receives the stored data from the input/output buffer in units of scanning, and that scans the received data, the scanned data being programmed in the memory cells according to a result of scanning the data; and
a control logic unit that controls the stored data in the input/output buffer in units of scanning to be selectively supplied to the data scanning unit based on states of the indicator bits, wherein
the storage unit of the input/output buffer includes,
a first storage unit that stores the data, and
a second storage unit that stores the indicator bits, and
the first storage unit includes first through $m^{th}$ data storage units that store the data in units of scanning, where m is an integer equal to or greater than 1, and
the second storage unit includes first through $m^{th}$ indicator bit storage units which respectively correspond to the first through $m^{th}$ data storage units.

2. The non-volatile memory device of claim 1, wherein the indicator bit storage unit stores the indicator bit with a first logic level if data stored in the corresponding data storage unit is to be programmed in the memory cells, and
the indicator bit storage unit stores the indicator bit with a second logic level if data stored in the corresponding data storage unit is not to be programmed in the memory cells.

3. The non-volatile memory device of claim 2, wherein the indicator bit storage unit stores the indicator bits with the second logic level when all the stored data in the corresponding data storage unit is logic high.

4. The non-volatile memory device of claim 3, wherein the control logic unit controls stored data to be supplied to the data scanning unit if the corresponding indicator bits have the first logic level.

5. The non-volatile memory device of claim 1, wherein the control logic unit comprises:
a data detecting unit that detects the data supplied to the input/output buffer; and
an indicator bit controller that controls writing of the indicator bits based on the results of the data detecting unit.

6. The non-volatile memory device of claim 5, wherein the indicator bit controller sets the corresponding indicator bit to a first logic level if at least one piece of the data to be written to the storage unit supplied in units of scanning is logic low, and
the indicator bit controller sets the corresponding indicator bit to a second logic level if all the data to be written to the storage unit supplied in units of scanning are logic high.

7. The non-volatile memory device of claim 5, wherein the control logic unit selectively senses a cell region of the memory cell array according to the states of the indicator bits to verify the result of programming during verification.

8. The non-volatile memory device of claim 7, wherein, the control logic unit controls the data stored in the input/output buffer in units of scanning to be selectively supplied to the data scanning unit based on the result of verification for data reprogramming.

9. The non-volatile memory device of claim 8, wherein the indicator bit controller sets the corresponding indicator bit to the first logic level if the result of verification reveals that a program error occurred in the data in units of scanning, and
the indicator bit controller sets the corresponding indicator bit to the second logic level if the result of verification reveals that the data in units of scanning is correctly programmed.

10. The non-volatile memory device of claim 1, wherein the memory cell array is a NOR type flash memory cell array.

11. A method of driving a non-volatile memory device with a memory cell array, the method comprising:
storing data in an input/output buffer;
writing indicator bits corresponding to the data in units of scanning;
controlling the stored data to be selectively output in units of scanning, based on the logic level of the indicator bits;
scanning the data that is selectively output in units of scanning; and
programming the data in the memory cell array according to a result of the scanning, wherein
the input/output buffer includes,
a first storage unit that stores the data, and
a second storage unit that stores the indicator bits, and
the first storage unit includes first through $m^{th}$ data storage units that store the data in units of scanning, where m is an integer equal to or greater than 1, and
the second storage unit includes first through $m^{th}$ indicator bit storage units which respectively correspond to the first through $m^{th}$ data storage units.

12. The method of claim 11, wherein the writing of the indicator bits comprises:
detecting values of the data in units of scanning; and
writing indicator bits to have a logic level according to results of the detecting.

13. The method of claim 12, wherein the writing of the indicator bits further comprises:

writing the indicator bits with a first logic level if the data in units of scanning includes data that is to be programmed in memory cells, and writing the indicator bits with a second logic level if the data in units of scanning does not include data that is to be programmed in the memory cells.

14. The method of claim 11, further comprising:

selectively sensing a cell region of the memory cell array according to the state of the indicator bits, the data stored in the memory cell array being sensed to verify the result of the programming.

15. The method of claim 14, further comprising:

selectively outputting the data stored in the input/output buffer in units of scanning according to the result of verification during data reprogramming.

16. The method of claim 15, wherein the selective outputting of the data in units of scanning during data reprogramming comprises:

outputting corresponding data in units of scanning if the result of verification reveals that a program error occurred in the data in units of scanning, and preventing corresponding data from being output in units of scanning if the result of verification reveals that the data in units of scanning is correctly programmed.

17. The method of claim 11, wherein the memory cell array is a NOR type flash memory cell array.

18. A non-volatile memory device comprising:

a memory cell array with a plurality of memory cells;

an input/output buffer having a storage unit that stores data and indicator bits representing information regarding the data;

a data scanning unit that receives the stored data from the input/output buffer in units of scanning, and that scans the received data, the scanned data being programmed in the memory cells according to a result of scanning the data; and a control logic unit that controls the stored data in the input/output buffer in units of scanning to be selectively supplied to the data scanning unit based on states of the indicator bits, wherein the storage unit of the input/output buffer includes, first through $m^{th}$ data storage units that store the data in units of scanning, where m is an integer equal to or greater than 1, and first through $m^{th}$ indicator bit storage units which respectively correspond to the first through $m^{th}$ data storage units.

19. The non-volatile memory device of claim 18, wherein the indicator bit storage unit stores the indicator bit with a first logic level if data stored in the corresponding data storage unit is to be programmed in the memory cells, and the indicator bit storage unit stores the indicator bit with a second logic level if data stored in the corresponding data storage unit is not to be programmed in the memory cells.

20. The non-volatile memory device of claim 19, wherein the indicator bit storage unit stores the indicator bits with the second logic level when all the stored data in the corresponding data storage unit is logic high.

* * * * *